(12) United States Patent
Specht et al.

(10) Patent No.: US 7,851,267 B2
(45) Date of Patent: Dec. 14, 2010

(54) POWER SEMICONDUCTOR MODULE METHOD

(75) Inventors: Benedikt Specht, Sundem (DE); Gottfried Ferber, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 268 days.

(21) Appl. No.: 11/874,550

(22) Filed: Oct. 18, 2007

(65) Prior Publication Data

US 2009/0104734 A1    Apr. 23, 2009

(51) Int. Cl.
*H01L 21/00* (2006.01)
(52) U.S. Cl. ...................... 438/121; 438/122
(58) Field of Classification Search ............... 438/121, 438/122, 125
See application file for complete search history.

(56) References Cited

U.S. PATENT DOCUMENTS

| | | | |
|---|---|---|---|
| 4,558,510 A | 12/1985 | Tani et al. | |
| 5,621,243 A | 4/1997 | Baba et al. | |
| 5,699,232 A | 12/1997 | Neidig et al. | |
| 6,087,682 A * | 7/2000 | Ando | 257/178 |
| 6,791,183 B2 | 9/2004 | Kanelis | |
| 7,023,056 B2 | 4/2006 | Liaw | |
| 2005/0230807 A1 | 10/2005 | Kodani et al. | |

\* cited by examiner

*Primary Examiner*—Steven Loke
*Assistant Examiner*—Kimberly M Thomas
(74) *Attorney, Agent, or Firm*—Dicke, Billig & Czaja, PLLC

(57) ABSTRACT

A method for assembling a power module includes providing a casing with a plurality of receiving elements. At least one substrate carrying at least one semiconductor chip is provided within the casing. At least one support element is provided. An elastically stressed cover is arranged over the at least one support element, and the cover is released so that the elastically stressed cover is restrained by the at least one support element and the plurality of receiving elements.

10 Claims, 8 Drawing Sheets

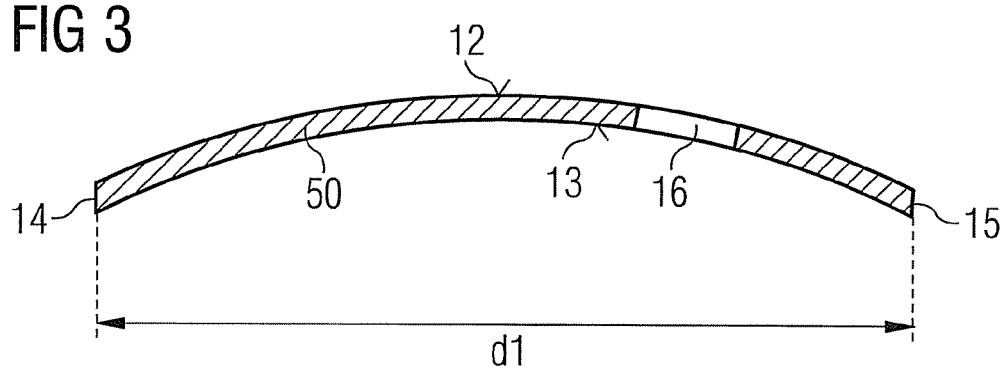
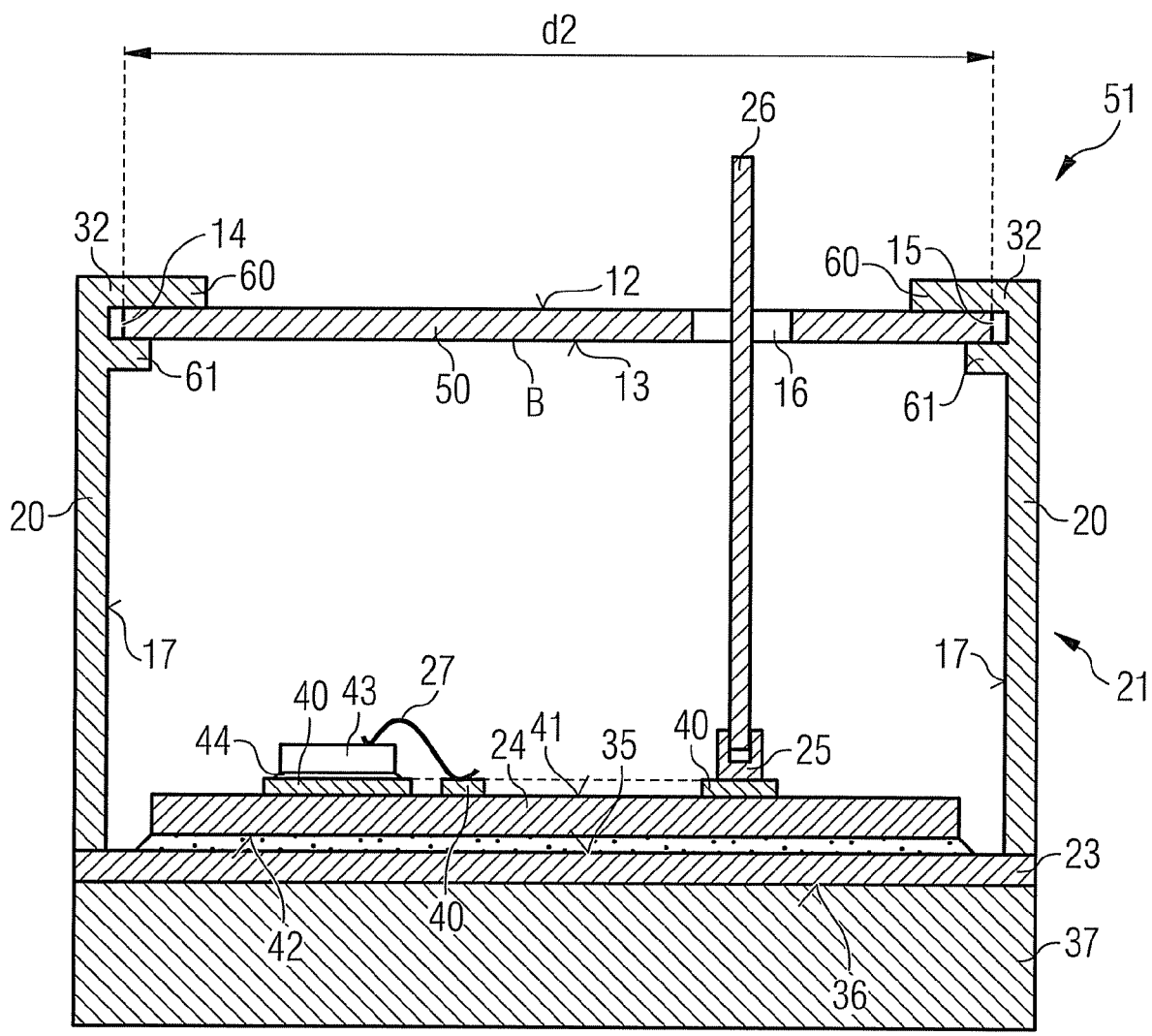

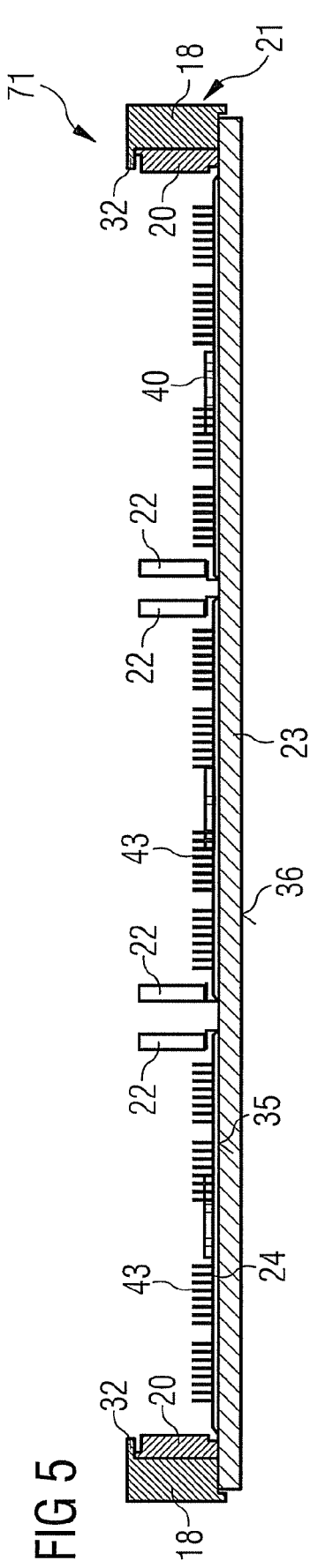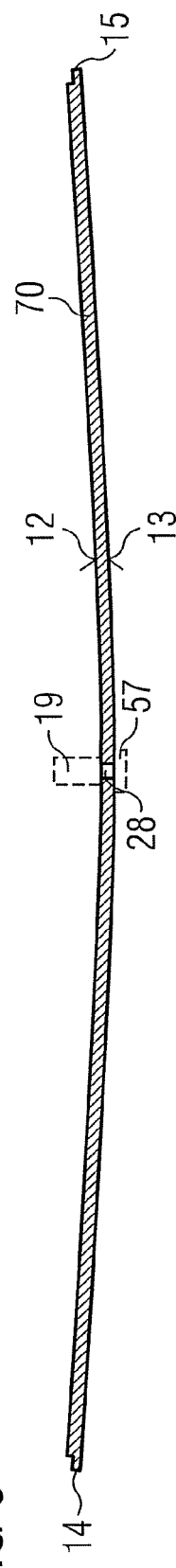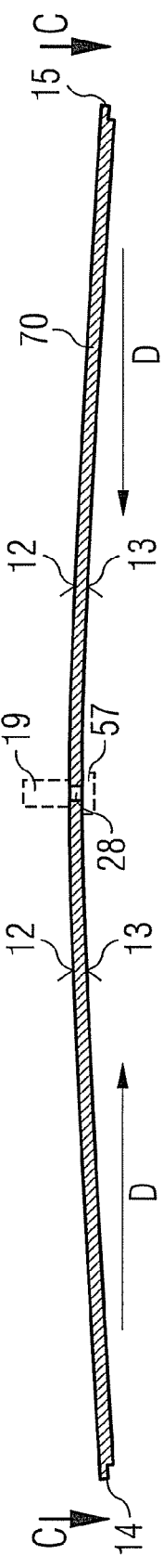

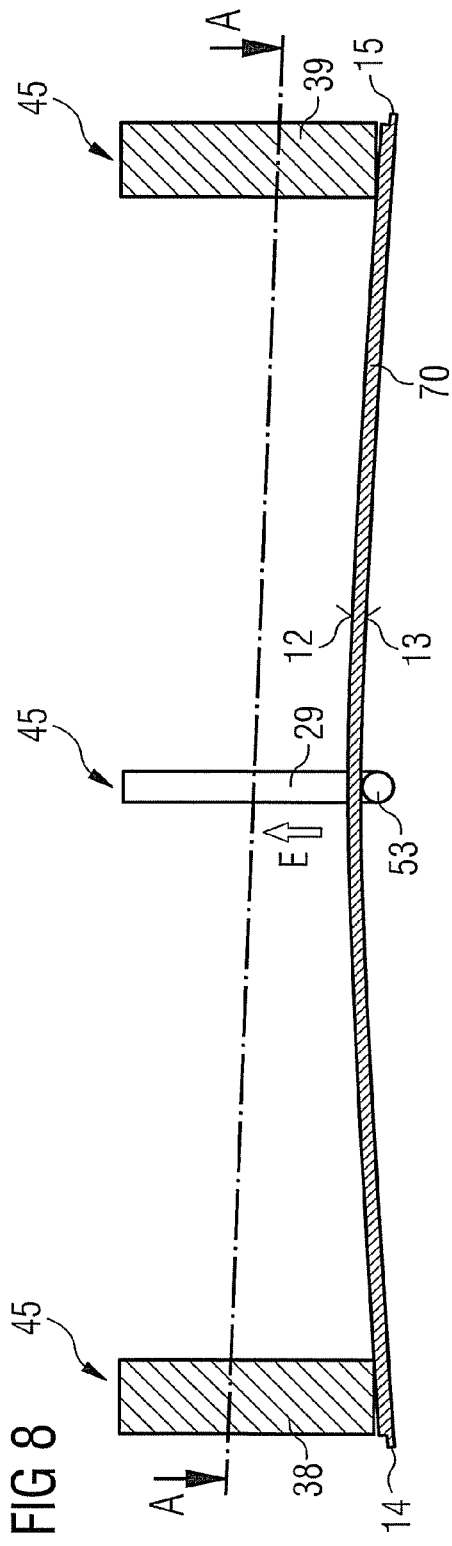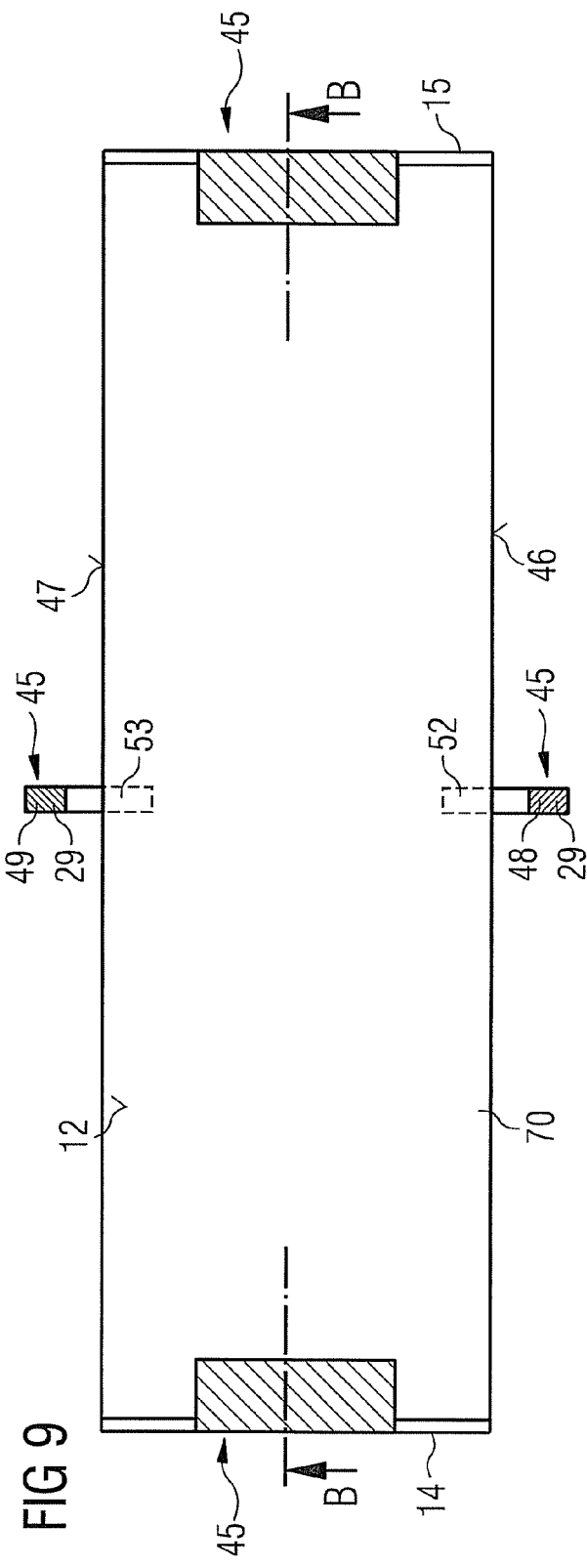

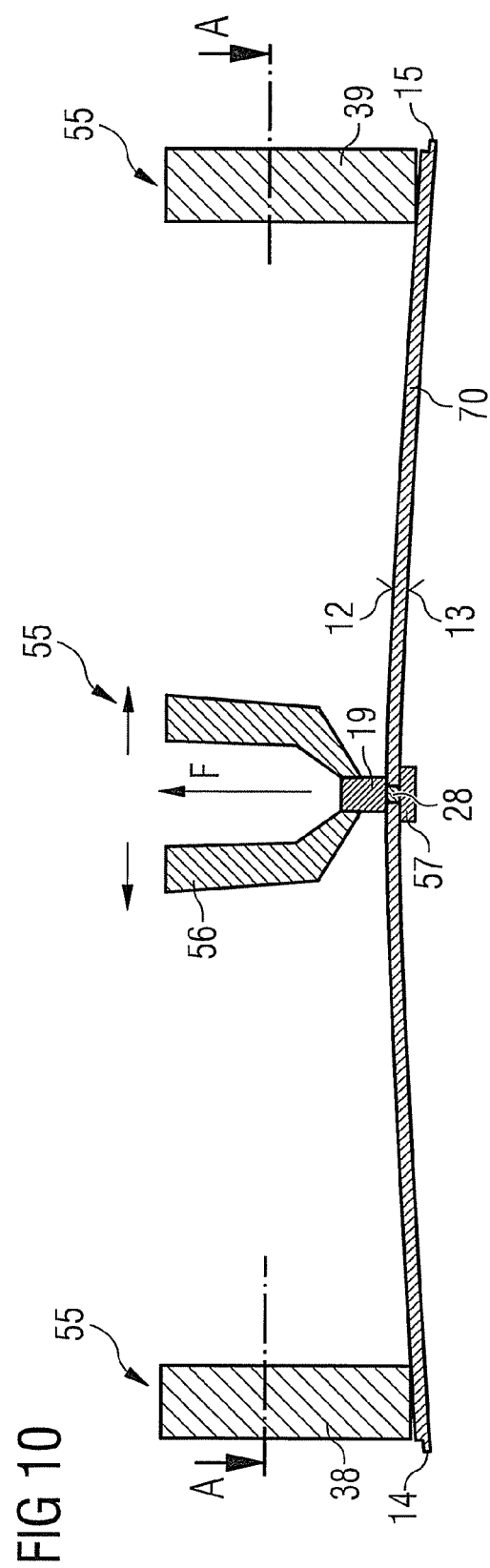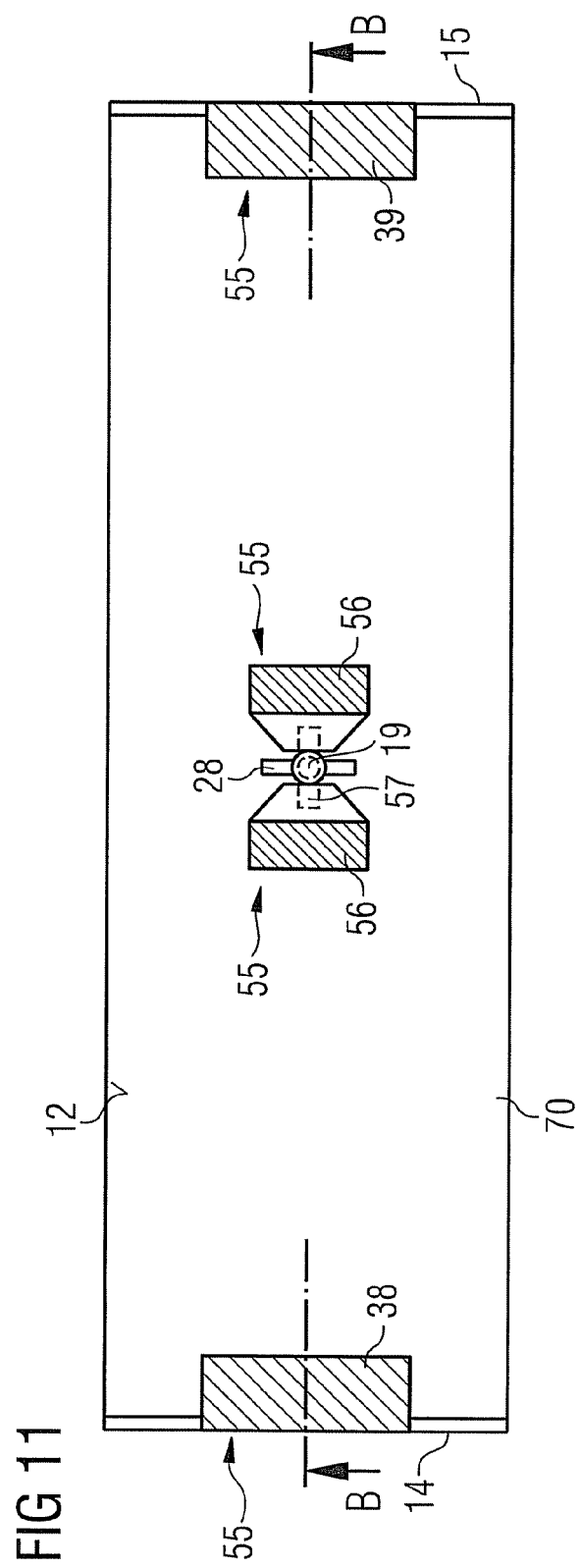

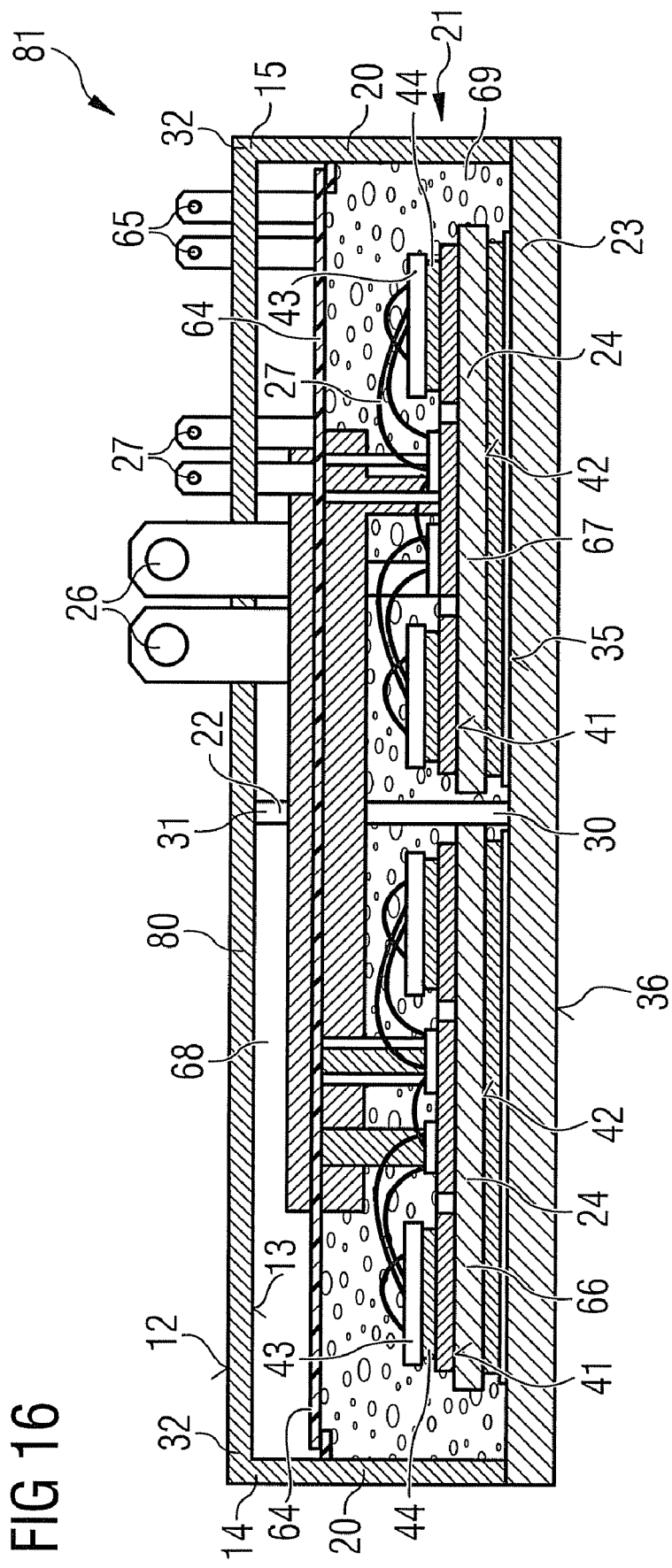

POWER SEMICONDUCTOR MODULE METHOD

BACKGROUND

Embodiments relate to a power semiconductor module.

A power semiconductor module or power module is designed to operate at relatively high voltages (for example, above 100 Volts) or at relatively high currents (for example, above 10 Amperes). The power semiconductor module includes at least a power semiconductor chip for switching, regulating, or rectifying electrical current, in particular high electrical current. Such a semiconductor module may include at least a silicon-controlled rectifier (SCR), power regulator, power transistor, insulated-gate bipolar transistor (IGBT), metal-oxide semiconductor field-effect transistor (MOSFET), power rectifier, Shottky diode, J-FET or any other power semiconductor switch. In operation, the power module, because of the high power it consumes, may generate a large amount of heat. The power module may also be operated in an environment that has an elevated temperature, for example, in an engine compartment. The heat generated by the power module may be dissipated by a heat sink attached to the power module.

SUMMARY

A method of assembling a semiconductor module includes: providing a casing with a plurality of receiving elements arranged on the casing; providing an electrically insulating substrate carrying at least one semiconductor chip, wherein the substrate is arranged within the casing; providing at least one support element; providing a cover, shaping the cover by elastically deforming it, arranging the cover at the at least one support element, and releasing the elastically deformed cover so that the elastically deformed cover is being restrained by the at least one support element and the plurality of receiving elements.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

The invention can be better understood with reference to the following drawings and description. The components in the figures are not necessarily to scale, instead emphasis being placed upon illustrating the principles of the invention. Moreover, in the figures, like reference numerals designate corresponding parts.

FIG. 3 is a cross sectional view of another cover of a novel power module;

FIG. 4 is a partial cross sectional view of a novel power module using the cover of FIG. 3;

FIG. 5 is a cross sectional view of an open casing for a novel power semiconductor in another embodiment;

FIG. 6 is a cross sectional view of a cover in an unstressed position;

FIG. 7 is a cross sectional view of a cover in a prestressed position;

FIG. 8 is a cross sectional view of a tool holding the cover of FIG. 7 in the prestressed position;

FIG. 9 is a top view of the prestressed cover and a cross sectional view of the tool along line A-A of FIG. 8;

FIG. 10 is a cross sectional view of another tool holding the cover of FIG. 7 in the prestressed position;

FIG. 11 is a top view of the prestressed cover and a cross sectional view of the tool of FIG. 10 in a cross-sectional plain A-A illustrated in FIG. 10;

FIG. 16 is a side view of an encapsulated basic module setup with terminals, resin and enclosure.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
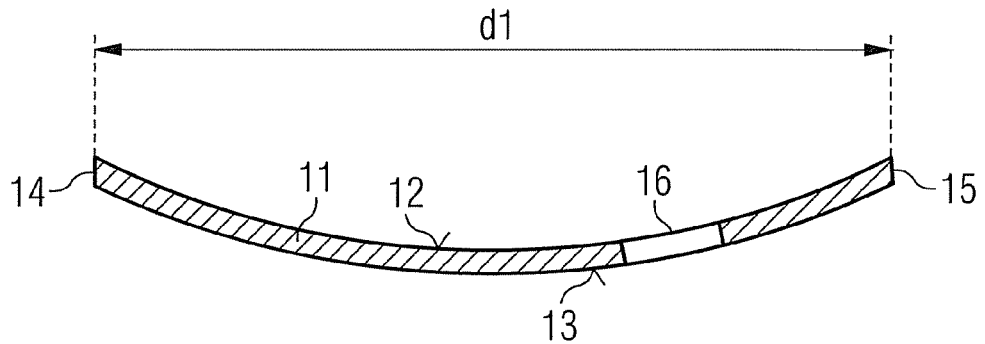
FIG. 1 is a cross sectional view of a cover of a novel power module.
Figure 2:
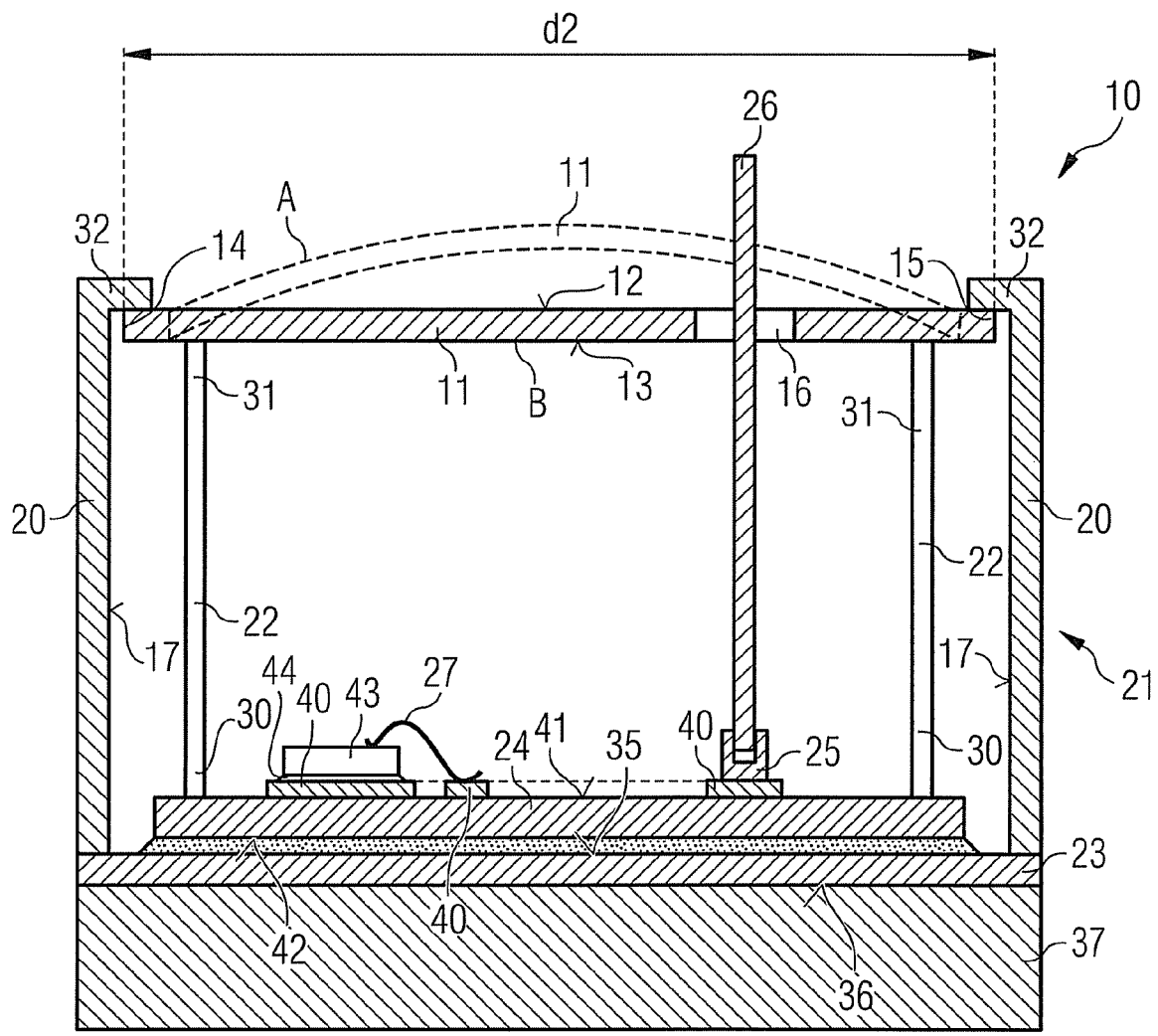
FIG. 2 is a partial cross sectional view of a novel power module using the cover of FIG. 1.

FIG. 1 illustrates a cover 11 to be used in connection with a power module 10 or power semiconductor module as illustrated in FIG. 2 in an unrestrained state before being mounted onto the power module 10. Such a power module 10 is designed to operate at relatively high voltages (for example, above 100 Volts) or at relatively high currents (for example, above 10 Amperes). The power module 10 includes an electrical circuit, for example, at least one semiconductor chip. The cover 11 has a top surface 12 and a bottom surface 13 that is opposite to its top surface 12. The cover 11 further includes a first end 14 that is arranged from a second end 15 in a distance d1. The cover 11 may include at least one through hole 16 which extends between the top surface 12 and the bottom surface 13. The cover 11 is bent such that—in the unrestrained state—a straight line from the first end 14 and the second end 15 of the cover 11 does not intersect with the central portion of the cover 11. The cover 11 may include any elastically deformable material, for example, plastics (thermoplastic plastics thermosetting plastics, epoxy resin, glass reinforced epoxy resin or the like) or metals (aluminium, aluminium-based alloys, copper, steel, or any other appropriate metal), and may have a thickness of 0.5 to 3 mm (millimeters) when using plastics and 0.1 to 1 mm when using a metal.

FIG. 2 is a partial cross-sectional view of the power module 10 including the cover 11 of FIG. 1. The power module 10 includes a casing 21 and a heat sink 37. The casing 21 encloses a plurality of support elements 22 in form of pillars, a base plate 23, a substrate 24, electrical circuitry (not illustrated in detail), and a plurality of terminals 26. The casing 21 is mounted on the heat sink 37. The substrate 24 is arranged above the base plate 23 in the casing 21 and a power semiconductor chip 43 and the plurality of terminals 26 are disposed on the substrate 24.

The cover 11 is arranged on the pillars forming the support elements 22. The casing 21 include walls 20 that are mounted on a base plate 23. The walls 20 face each other in a minimum distance d2 forming in the cross section a hollow rectangular block. A receiving element 32 in form of a protrusion is provided on a top edge of an inner surface 17 of the wall 20. The support elements 22 are arranged within the casing 21. Each one of the support elements 22 has a top portion 31. The cover 11 is arranged on the top portion 31 and in contact with this portion 31. The support elements 22 have a shape of a rectangular block and may be made, at least partially, from plastic material.

FIG. 2 illustrates the elastically deformable cover 11 in an interim position A and in a mounted position B. The cover 11 is in an elastically deformed state when the cover 11 is in the interim position A. The cover 11 is elastically deformed such that the first and second ends 14 and 15 of the cover 11 are closer to a surface 41 of the substrate 24 than the central portion of the cover 11. The first and second ends 14 and 15 of the cover 11 are located underneath the receiving elements 32 in the casing 21 while a part of the cover 11 is arranged on the support elements 22. The terminals 26 of the power module 10 extend through holes 16 in the cover 11.

In the mounted position B, the first and second ends 14 and 15 of the cover 11 are located underneath the receiving elements 32 of the casing 21 and a part of the cover 11 is arranged on the support elements 22. The cover 11 is in an elastically deformed state when the cover 11 is in the position B. The cover 11 is elastically deformed such that the first and second ends 14 and 15 of the cover 11 are closer to a surface 41 of the substrate 24 than the central portion of the cover 11. The orthogonal distance between a straight line including the first and second ends 14 and 15 and the central portion of the cover 11 in position B of the cover 11 is less than the distance when the cover 11 is in position A.

The base plate 23 is arranged above the heat sink 37 and below the substrate 24. The base plate 23 may include copper material and may have a thickness of 2 mm to 10 mm, for example, 3 mm (millimetre) whereas the heat sink 37 includes, for example, aluminium material. Alternatively the substrate 24 may be directly attached to the heat sink. In this case no base plate 23 is needed. The substrate 24 includes copper tracks 40 on an insulating material that are disposed on top of the surface 41 of the substrate 24. The substrate 24 may include a layer of aluminium oxide of 350 μm to 450 μm, for example, 380 μm (micrometer) thickness. The electrical circuitry provided on the substrate 24 includes one or more semiconductor chips 43. The semiconductor chip 43 is arranged on the copper track 40 and is attached to the copper track 40 by a layer of chip-solder 44 or other known joining material. Aluminium or copper bonding wires 27 connect the semiconductor chip 43 to an adjacent copper track 40 or to an adjacent further semiconductor chip (not illustrated). The copper tracks 40 each may have a thickness of 50 μm to 2000 μm, for example, 300 μm.

A sleeve 25 is attached to the copper track 40 such that an axis of a collar of the sleeve 25 is aligned perpendicularly to the surface 41 of the substrate 24 whereon the copper track 40 is disposed. The sleeve 25 has a shape of a hollow cylinder or a plug like form, and may include copper material. The terminal 26 is arranged partially within the sleeve 25 and is in contact with the sleeve 25. A top end of the terminal 26 extends above and through the cover 11. The terminal 26 may include copper material.

The copper track 40 forming a conductive connection track includes a pad of electrically conductive material. The sleeve 25 forms an electrically conductive connector and may be soldered onto the pad of the electrically conductive copper track 40. The semiconductor chip 43 is capable of carrying high voltage and/or high current and may be a silicon-controlled rectifier SCR, a power regulator, a power transistor, a insulated-gate bipolar transistor IGBT, a metal-oxide semiconductor field-effect transistor MOSFET, a power rectifier, a Shottky diode, a J-FET or the like.

In a broader sense, FIG. 2 also illustrates a module wherein the receiving element 32 may be a kind of restraining element. The receiving element 32 may also have the form of a recess or a groove as illustrated in FIG. 2. The receiving element 32 may be integrally attached to the casing 21 or have the form of a separate component that is attached to the casing 21. The support element 22 is in the form of a pillar. Alternatively, the support element 22 may be a kind of spring. The support element 22 may be secured to the bottom of the casing 21 or to the wall 20 of the casing 21 or may also be secured to any other component that is within the casing 21. The support element 22 or part of the support element 22 may have the shape of a cylinder, partial cylinder, rectangular block, or partial rectangular block. Other shapes are applicable as well. The support element 22 may be arranged above or below the cover 11.

The casing 21 may also be a hollow cylinder block, a partial hollow cylinder block, a hollow rectangular block, or a partial hollow rectangular block, or any other shape. The wall 20 of the casing 21 may include an opening or aperture if needed. Further, the casing 21 may include metal material for good thermal conduction. Also the cover 11 may be made from or contain metal material. It may include more than one bend and/or additional openings for dissipating heat out of the casing 21. A portion of the cover 11 may have a partial circular or partial rectangular shape. Other shapes for the cover 11 are applicable as well.

The electrically conductive tracks 40 of the substrate 24 may be electrically connected to those of adjacent substrates. The copper tracks 40 may include metal such as, for example, aluminum, an alloy of aluminum, copper or an alloy of copper with an optional nickel, gold or any other appropriate plating. The semiconductor chip 43 is located on the electrically conductive track(s) and connected thereto by a layer of solder material. The bonding wire 27 connected to the semiconductor chip 43 may include aluminum (or an alloy of aluminum), copper or gold material. The terminal 26 forms a contact connector element. The shape of the contact connector element is appropriately chosen to engage an external electrical connector with the sleeve 25. The contact connector element may include a spring section and utilise a conductive material such as, for example, copper or an alloy of copper.

The casing 21 provides a shielding for the parts inside the casing 21 against environmental influences. The casing 21 and the heat sink 37 dissipate heat generated within the operational power module 10. The protrusions on the casing 21 together with the pillars act also as a simple mechanism for securing the elastically deformed cover 11 onto the casing 21. The cover 11 also provides protection from the high voltage within the power module 10.

The heat conducting base plate 23 and the heat sink 37 dissipate heat that is generated within the power module 10. The substrate 24 provides an electrical isolation between the semiconductor chip 43 and the base plate 23. The copper track 40 on the substrate 24 may be adapted for direct copper bonding of the semiconductor chip 43 onto the substrate 24.

When assembling the power module 10, upon provision of the base plate 23, the substrate 24 is arranged on the top surface 35 of the base plate 23 and the semiconductor chip 43 is adhered to the copper tracks 40 by solder 44 and bonded to the copper tracks 40 using aluminium bonding wires 27. The at least one sleeve 25 is fixed to the copper track 40 and the pillars 22 are attached to the substrate 24 (or the bottom of the casing 21). The base plate 23, the insulating substrate 24, and the semiconductor chip 43 are placed within the casing 21. Then, the terminal 26 is inserted into the sleeve 25.

The cover 11 may be stamped or shaped. After shaping, the central portion of the cover 11 is lower than its first and second ends 14 and 15 with respect to the surface 41 of the substrate 24. The stamped cover 11 may have a shape as illustrated in FIG. 1. The elastically deformable cover 11 has no or little internal stress unless applying an external force.

Then, by an external force the first and second ends 14 and 15 are pushed towards each other. The cover is elastically deformed such that the central portion of the cover 11 is higher than the first and second ends 14 and 15 with respect to the surface 41 of the substrate 24. The elastically deformed cover 11 may have a shape as illustrated as interim position A in FIG. 2. The cover 11 is elastically deformed such that the cover 11 returns to the shape when no force was applied. The elastically deformed cover 11 experiences an internal stress and seeks to release the internal tension by changing its shape to the original shape that has less internal tension.

The first and second ends 14 and 15 of the cover 11 are then arranged underneath the receiving elements 32 of the casing 21 while the cover 11 is arranged over the support elements 22. The external force is removed from the cover 11 and the elastically deformed cover 11 attempts to release its internal stress but is restrained from doing so by the support elements 22 and the receiving elements 32. The height of the support elements 22 limits the minimum distance that is between the cover 11 and the surface 41 of the substrate 24 at the bottom of the casing 21. The receiving elements 32 limit also the minimum distance between the first and second ends 14 and 15 of the cover 11. The partly restrained, elastically deformed cover 11 has a shape as illustrated in position B of FIG. 2. In position B, the cover 11 has a plane shape with a maximum distance d2 between the first and second ends 14 and 15. In this state, the cover 11 is held in its place by the force exerted by the receiving elements 32 and the support elements 22. The method, thus, provides a simple way of securing the cover 11 onto the casing 21 that is able to withstand vibration and extreme temperatures. Furthermore, there is no need to use other fastening components such as rest-hooks, screws, or adhesive means. However, additional fastening components may be applied.

In a more general sense, the cover 11 that is mounted onto the casing 21 is kept in an elastically deformed state by the support elements 22 and the receiving elements 32. The cover 11 may be in a form such that the central portion of the cover is above or below the outer portion of the cover 11 with respect to the surface 41 of the substrate 24 given an appropriate placement of the support elements and the receiving elements. The application of external force deforming the elastically deformable cover may be appropriately applied to the edge, to the corner or to an inner portion of the cover 11.

FIG. 3 illustrates another cover 50 for another power module 51 in an unrestrained state before being mounted to the power module 51 illustrated in FIG. 4. The cover 50 has a top surface 12 and a bottom surface 13 that is opposite to its top surface 12. The cover 50 includes a first end 14 that is arranged in the distance d1 from a second end 15 of the cover 50. The cover 50 include a through hole 16. The cover 50 is bent such that—in the unrestrained state—the first and second ends 14 and 15 of the cover 50 are underneath the central portion of the cover 50.

FIG. 4 is a partial cross sectional view of the power module 51. In its basic structure, the power module 51 is similar to the power module 10 of FIG. 2 whereby corresponding parts have like reference numerals. The power module 51 include a casing 21 and a heat sink 37. The casing 21 surrounds a base plate 23, a substrate 24, electrical circuitry including a semiconductor chip 43, and a terminal 26. The casing 21 is fixed to the heat sink 37 which is arranged below the casing 21. The substrate 24 is located on top of the base plate 23 and on top of the substrate 24, the electrical circuitry and the terminal 26 is arranged on the substrate 24. The casing 21 includes walls 20 that are mounted to the heat sink 37. The walls 20 include protrusions 61 and pillars 60. The protrusions 61 and the pillars 60 integrated into the wall 20.

The walls 20 form a hollow rectangular block. Opposing walls 20 are located in a minimum distance d2 from each other. The walls 20 have an inner surface 17 wherein the protrusion 61 is provided on a top portion of the inner surface 17. The pillars 60 are arranged above the protrusion 61 and on an edge of the wall 20. The pillars 60 are in a form corresponding to protrusion 61 and have each a length longer than the length of the protrusion 61. The cover 50 is located between the pillars 60 and the protrusions 61. The elastically deformable cover 50 when mounted as in position B is in an elastically deformed state such that a straight line from the first end 14 to the second end 15 of the cover 50 intersects with a central portion of the cover 50. However, the first and second ends 14 and 15 of the cover 50 are higher than the central portion of the cover 50 with respect to the surface 41 of the substrate 24 while inserting the cover 50 into the casing 21 (not illustrated in FIG. 4).

The first and second ends 14 and 15 of the cover 50 are located above the protrusions 61 and below the pillars 60, whereby the cover 50 is in contact with the protrusion 61 and the pillars 60. The terminal 26 (for example, a pin) extends through a through hole 16' of the cover 50. The base plate 23 is located on top of the heat sink 37 and underneath the substrate 24' whereby copper tracks 40 are disposed on the top surface 41 of the substrate 24. The electrical circuitry is arranged on the copper track 40 and includes at least one semiconductor chip 43. An aluminum bonding wire 27 connects the semiconductor chip 43 to, for example, adjacent copper tracks or to a further semiconductor (not illustrated). A sleeve 25 is provided on the copper track 40. Terminal 26 is arranged inside the sleeve 25 and is in contact with the sleeve 25. A top end of the terminal 26 extends above and through the cover 50. In the arrangement of FIG. 4, the pillar 60 serves as a support element; the support element is, for example, arranged above the cover 50 but may alternatively be arranged below the cover 50. In the arrangement of FIG. 4, the protrusion 61 serves as a receiving element. The support element and the receiving element are located in position B illustrated in FIG. 4 on opposite sides of the elastically deformed cover 50.

A method of assembling the power module 51 includes the step of providing the casing 21 that includes the protrusions 61 and the pillars 60. The cover 50 may be stamped and after stamping, the shape of the cover 50—in an unrestrained state—is such that the central portion of the cover 50 is higher than the first and second ends 14' and 15' of the cover 50. The central portion of the cover 50 does not intersect with a straight line including the first and second ends 14' and 15' of the cover 50. The stamped cover 50 has the curved shape as illustrated in FIG. 3. Then, an external force elastically deforms the cover 50 such that the central portion of the cover 11 is lower than the first and second ends 14 and 15 with respect to the surface 41 of the substrate 24. The cover 50 is elastically deformed in a manner that the shape of the cover 50 returns to the shape of the stamped cover 50 if the external force is released.

The second ends 14 and 15 of the cover 50 are then arranged between the protrusions 61 and the pillar 60. Upon this, the external force is released from the cover 50. The elastically deformed cover 50 attempts to change its shape to release its internal tension but is restrained from doing so by the pillars 60 and protrusions 61. The position of the pillar 60 limits the maximum distance between the cover 50 and the surface 41 of the substrate 24 at the bottom of the casing 21, and the protrusions 61 limit the minimum distance between the first and second ends 14 and 15 of the cover 50. The shape of the restrained cover 50 is illustrated in a mounted position B of the cover 50 in FIG. 4. In this state, the cover 50 is held in its place by the forces exerted onto the cover 50 by the protrusions 61 and pillars 60.

The method for assembling the power module illustrated in FIG. 4 is a simple way for securing an elastically deformable cover 50 to a casing 21. The cover 50 is restrained, in an elastically deformed state, by protrusions 61 and pillars 60. The cover 50 is elastically deformed and arranged onto the casing 21 such that the ends 14 and 15 of the cover 50 are in a straight line, above or below the central portion of the cover 50 with respect to the surface 41 of the substrate 24 depending on the design of the support elements and the receiving elements.

FIG. 5 is a cross sectional view of an open casing 21 for a power module 71 of a further embodiment. All circuit elements are mounted within the casing 21, like substrate 24 and semiconductor chip 43. The casing 21 include a frame 18 which surrounds the walls 20 with receiving elements 32 at the top of the frame 18 for receiving a cover of the whole open casing 21. Since the opening of the casing 21 is relatively large there is a plurality of support elements 22 provided to keep the cover in a straight plane, when positioned between the receiving elements 32 at the top of the walls 20.

FIG. 6 is a cross sectional view of a cover 70 in an unstressed position. In the unstressed position the cover is bent such that the center of the cover 70 is in a lower position than the first and second ends 14 and 15 of the cover 70. In the center, a small cut 28 may be provided where a tow pin 19 may be placed to tow the cover 70 into a position in which the cover 70 is stressed. The contour of the tow pin 19 is marked by dashed lines.

FIG. 7 is a cross sectional view of the cover 70 in a stressed position. In such a stressed position the cover 70 is bent such that the center of the cover 70 is in a higher position than the edges 14 and 15. This stressing is achieved by forcing the edges 14 and 15 of the cover 70 in the directions marked by arrows C and D.

FIG. 8 is a cross sectional view of a tool 45 holding the cover 70 of FIG. 7 in the stressed position before being inserted into the casing 21. While the ends 14 and 15 are hold in position by stamps 38 and 39 a clamp 29 grabs the center of the cover 70 and pulls it in the direction of the arrow E. With this tool 45, neither a small cut nor a tow pin is necessary to pull the cover 70 in a stressed position, since the clamp grabs the center of the cover 70 only at regions on the sides 46 and 47 of the cover 70 as illustrated in FIG. 9.

FIG. 9 is a top view of the stressed cover 70 and a cross sectional view of the tool 45 in a cross sectional plain A-A of FIG. 8. At the ends 14 and 15 the stamps 38 and 39 are illustrated. In the center of the cover 70 the clamp 29 grabs with its arms 48 and 49 having hooks 52 and 53 under the sides 46 and 47 of the cover 70 to stress the cover 70 together with the stamps 38, 39 as illustrated in FIG. 8. The clamp 29 may have only one arm 48 and only one hook 52. The hook 52 may extend from the side 46 to the side 47 of the cover 70.

FIG. 10 is a cross-sectional view of another tool 55 holding the cover 70 illustrated in FIG. 7 in the stressed position before being inserted into the casing 21. While the ends 14 and 15 of the cover 70 are hold in position by stamps 38 and 39 a clamp 56 grabs a tow pin 19 positioned in a small central cut 28 of the cover 70. To fix the tow pin 19 a foot part 57 of the tow pin 19 is introduced through the small cut 28 and turned around by about 90°. Then the clamp 56 grabs the pin 19 and pulls it in the direction of arrow F to stress the cover 70.

FIG. 11 is a top view of the stressed cover 70 and a cross sectional view of the further tool 55 in a cross sectional plain A-A of FIG. 10. In the center of the cover 70 a small cut 28 is provided through which the tow pin 19 with its foot part 57 is introduced and turned around by around 90° so that the clamp 56 can pull it as illustrated in FIG. 10. The center of the cover 70 is in the stressed position higher than the ends 14 and 15 and the projected length of the cover 70 with respect to the opening of the open casing 21 given by the distance between the ends 14, 15 of the cover 70 is now smaller than the opening of the open casing 21 illustrated in FIG. 5.

Figure 12:
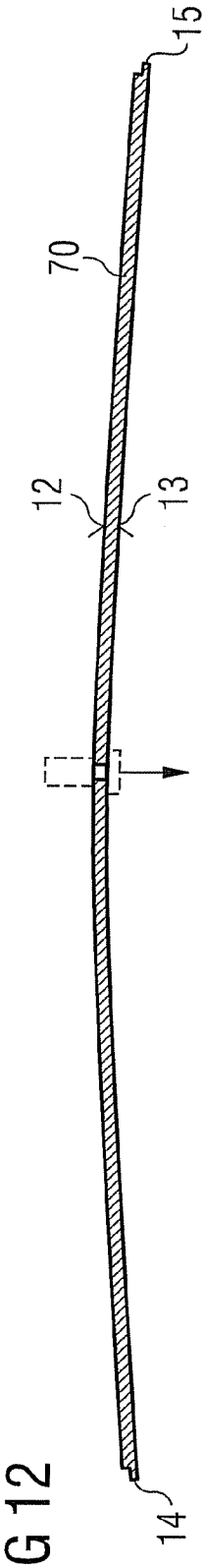
FIG. 12 is a cross sectional view of the cover of FIG. 7 before placing the cover on the open casing of FIG. 5.

FIG. 12 is a cross sectional view of the cover 70 of FIG. 7 before placing the cover 70 into the open casing 21 of FIG. 5. As mentioned above, the distance between the ends 14, 15 of the bent and stressed cover 70 is now smaller than the opening of the open casing 21 of FIG. 5. Therefore, the cover 70 can be placed with the aid of one of the tools 45 or 55 illustrated in FIG. 8 and FIG. 10, respectively, into the opening of the open casing 21 illustrated in FIG. 13.

Figure 13:
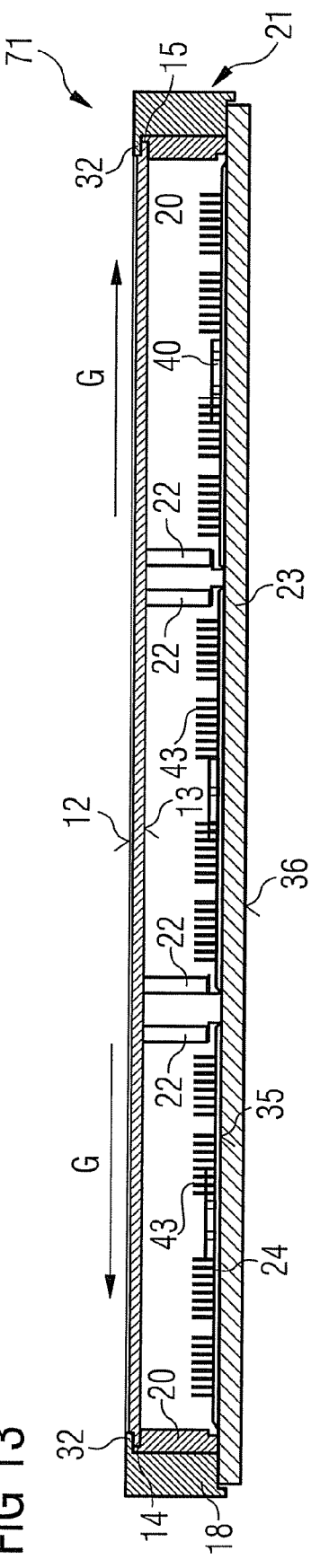
FIG. 13 is a cross sectional view of the casing of FIG. 5 closed by the cover of FIG. 12.

FIG. 13 is a cross sectional view of the opening of the casing 21 closed by the cover 70 of FIG. 12. The prestressed cover 70 released from the tool 45 or 55 illustrated in FIG. 8 and FIG. 10, respectively, rebends itself in the directions of arrows G. The cover 70 fits into the receiving elements 32 of the walls 20 of the casing 21. Furthermore, the cover 70 is now supported by a plurality of support elements 22 of the casing 21 pushing the substrates 24 against the base plate 23 for an improved dissipation of heat generated in the semiconductor chip 43.

Figure 14:
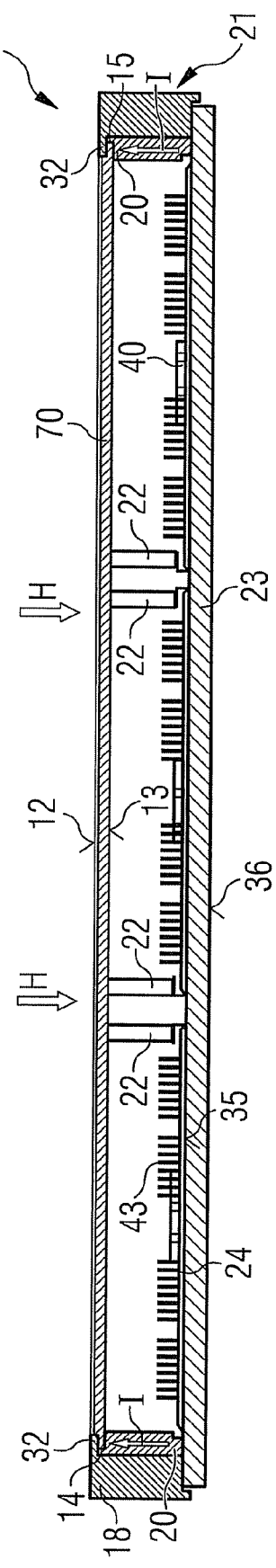
FIG. 14 is a cross sectional view of another novel power semiconductor module.

FIG. 14 is a cross sectional view of the power module 71 after closing the casing 21 with the cover 70. Since the cover 70 was bent in an opposite direction with respect to its unstressed position before being inserted into the casing 21, the cover 70 presses now in the direction of arrows H towards the support elements 22 and in the direction of arrows I toward the receiving elements 32 of the wall 20 of the casing 21. Inside the casing different power circuits with at least one semiconductor chip 43 are arranged. This semiconductor chip 43 can be positioned on conductive circuit lines or tracks on the insulating substrate 24 which is fixed to a base plate 23 forming the bottom surface 36 of the casing 21.

Figure 15:
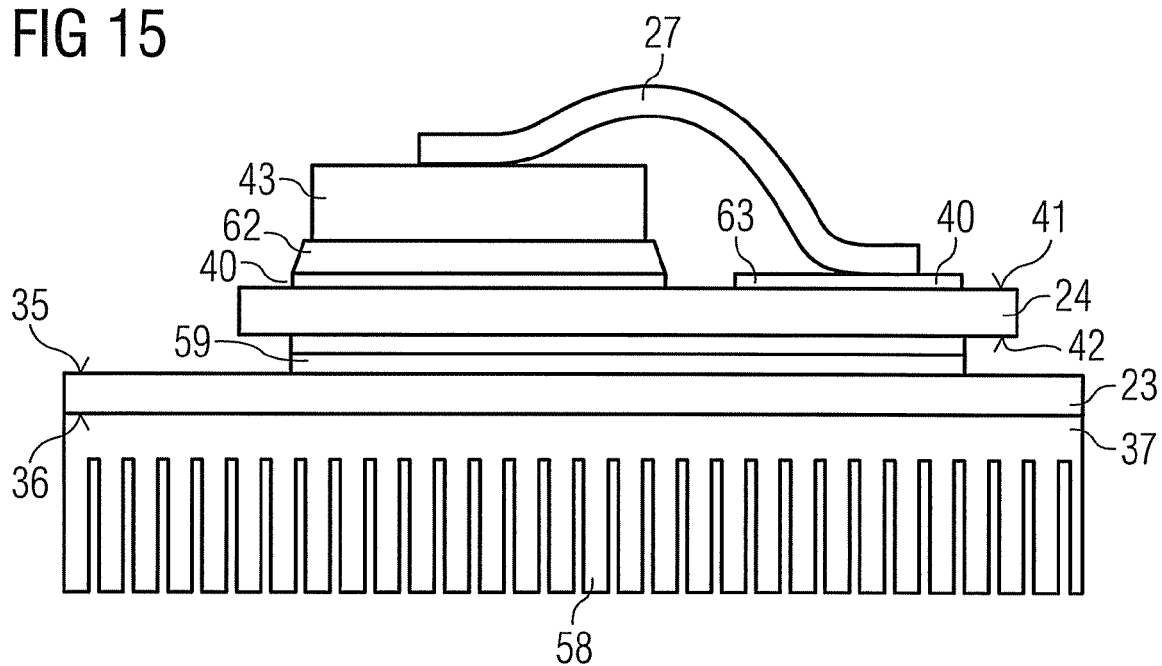
FIG. 15 is a side view of a basic module setup without terminals, potting and enclosures.

FIG. 15 illustrates a basic module setup without terminals, potting and enclosures. The layers of this FIG. 15 are not to scale. The base plate 23 is made of copper or copper-alloys. This base plate 23 is positioned on a heat sink 37 having a plurality of cooling fins 58 for heat dissipation. An insulating substrate 24 is fixed to the base plate 23 by a first layer 59 of solder. Conductive connection tracks 40 are placed on the surface 41 of the substrate. A power semiconductor 43 is fixed to the tracks 40 by a second layer 62 of solder. The semiconductor chip 43 is electrically connected for example with a contact pad 63 of the conductive connection track 40 by a bond wire of aluminium. The insulating substrate 24 may be made of a ceramic plate material which is copper plated on both surfaces 41 and 42.

FIG. 16 illustrates an encapsulated basic module setup 81 with terminals, resin, enclosure, including power terminals 26 through a module enclosure 80 as a top cover. Furthermore, the basic module includes a printed circuit board 64 for interconnections of internal driving terminals 65. Between the printed circuit board 64 and the top enclosure 80 a hard potting 68 is placed optionally for example of an epoxy resin. The basic module setup 81 includes a first substrate 66 and a second substrate 67. A support element 22 is disposed between both substrates 66 and 67. Substrates 66 and 67 are placed and soldered on a base plate made of copper or aluminium-silicon-carbide or metal-ceramic material. The space between printed circuit board 64 and base plate 23 is filled up with a soft potting 69.

Figure 17:
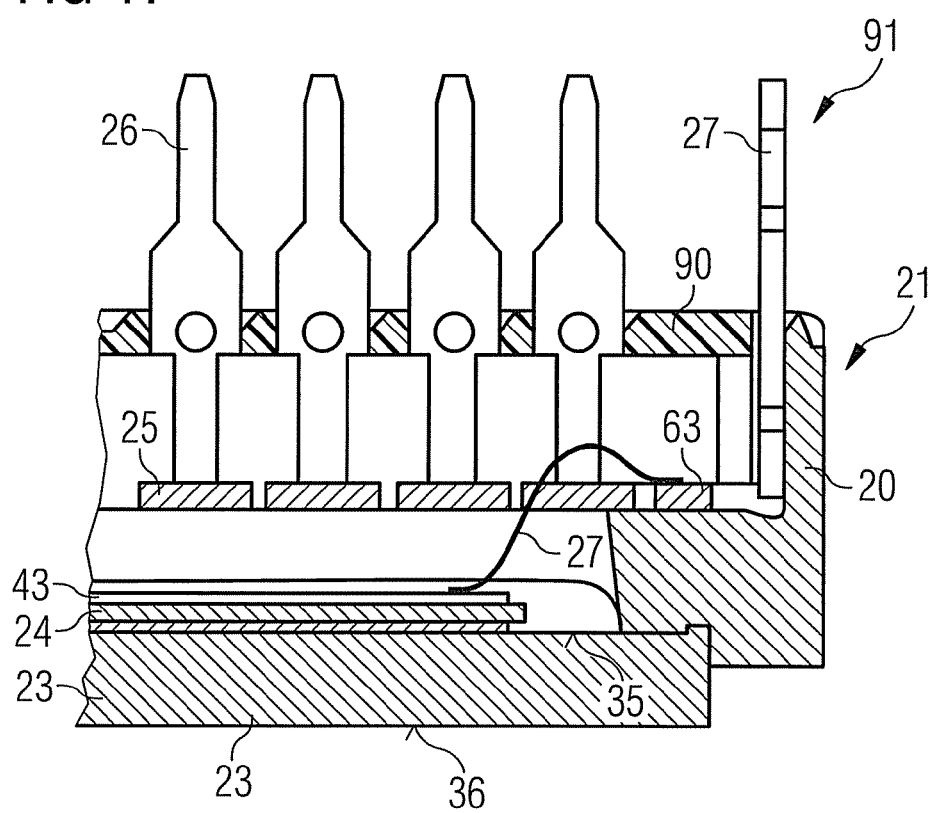
FIG. 17 is a cross sectional view of another novel power semiconductor module.

FIG. 17 is a cross sectional view of a further power module 91 in detail. Power terminals 26 are positioned through holes 16 of a cover 90 and are contacting sleeves 25 within the casing 21. These sleeves 21 are connected with contact pads 63. From the contact pad 63 bonding wires 27 contact bond pads on the surface of at least one semiconductor chip 43 which is soldered to a substrate 24. The substrate 24 is fixed by a solder layer on the surface 35 of the base plate 23.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for assembling a power module comprising:
providing a casing comprising a plurality of receiving elements;
providing within the casing a substrate carrying a semiconductor chip;
providing a support element; and
providing an elastically stressed cover having an unrestrained state in which ends of the cover are bent in a first direction relative to a cover center, and arranging the elastically stressed cover over the support element, and releasing the cover so that the elastically stressed cover is being restrained by the support element and the plurality of receiving elements, and the ends of the cover are bent in a second direction, opposite the first direction, relative to the cover center.

2. The method of claim 1 further comprising providing a plurality of conductive connection tracks on a surface of the substrate.

3. The method of claim 2 further comprising providing a solder material on the conductive connection track.

4. The method of claim 3 further comprising providing the semiconductor chip on the solder material.

5. The method of claim 4 further comprising electrically connecting the semiconductor chip to the conductive connection track with the solder material.

6. A method comprising:
providing a housing having receiving elements;
arranging at least one electrically insulating substrate inside the housing;
providing at least one support element;
providing an elastically deformed cover having an unrestrained state in which it is curved in a first direction; arranging the elastically deformed cover over the at least one support element, and releasing the elastically deformed cover so that the elastically deformed cover is being restrained by the at least one support element and the receiving elements and the elastically deformed cover is curved in a second direction that is opposite of the first direction in the restrained state.

7. The method of claim 6 further comprising providing a plurality of conductive connection tracks on a surface of the insulating substrate.

8. The method of claim 7 further comprising providing a solder material on the conductive connection track.

9. The method of claim 8 further comprising providing a semiconductor chip on the solder material.

10. The method of claim 9 further comprising electrically connecting the semiconductor chip to the conductive connection track with the solder material.

* * * * *